(12) United States Patent
Graham et al.

(10) Patent No.: US 8,647,930 B2
(45) Date of Patent: Feb. 11, 2014

(54) WAFER WITH RECESSED PLUG

(75) Inventors: Andrew B. Graham, Redwood City, CA (US); Gary Yama, Mountain View, CA (US); Gary O'Brien, Palo Alto, CA (US)

(73) Assignee: Robert Bosch GmbH, Stuttgart (DE)

( * ) Notice: Subject to any disclaimer, the term of this patent is extended or adjusted under 35 U.S.C. 154(b) by 127 days.

(21) Appl. No.: 13/232,268

(22) Filed: Sep. 14, 2011

(65) Prior Publication Data
US 2012/0261800 A1 Oct. 18, 2012

Related U.S. Application Data

(60) Provisional application No. 61/475,457, filed on Apr. 14, 2011.

(51) Int. Cl.
*H01L 21/00* (2006.01)
*H01L 21/84* (2006.01)

(52) U.S. Cl.
USPC ............................ 438/149; 438/479; 438/517

(58) Field of Classification Search
None
See application file for complete search history.

(56) References Cited

U.S. PATENT DOCUMENTS

| | | |
|---|---|---|
| 6,664,126 B1 | 12/2003 | Devoe et al. |
| 6,913,941 B2 | 7/2005 | O'Brien et al. |
| 7,056,757 B2 | 6/2006 | Ayazi et al. |
| 7,825,484 B2 | 11/2010 | Martin et al. |
| 2005/0032266 A1 | 2/2005 | Suzuki |
| 2007/0275537 A1 | 11/2007 | Henson et al. |
| 2010/0032775 A1 | 2/2010 | Morris, III et al. |
| 2010/0258869 A1 | 10/2010 | Morita et al. |
| 2010/0295138 A1 | 11/2010 | Montanya Silvestre et al. |

OTHER PUBLICATIONS

Candler et al., "Long-Term and Accelerated Life Testing of a Novel Single-Wafer Vacuum Encapsulation for MEMS Resonators," Journal of Microelectromechanical Systems, Dec. 2006, pp. 1446-1456, vol. 15, No. 6, IEEE, USA (11 pages).
Chen et al., "An Integrated Solution for Wafer-Level Packaging and Electrostatic Actuation of Out-of-Plane Devices," Paper from Stanford University, 2009, pp. 1071-1074, IEEE, USA (4 pages).
Chen, "Electrode Integrated Wafer-Level Packaging for Out-of-Plane MEMS Devices," Abstract Preview, International Microelectronics and Packaging Society, 2009, USA (1 pages).
Hyldgård et al., "Fish & Chips: Single Chip Silicon MEMS CTDL Salinity, Temperature, Pressure and Light Sensor for Use in Fisheries Research," Sensors, 2005, IEEE, pp. 1124-1127 (4 pages).
Park et al., "Untraminiature encapsulated accelerometers as a fully implantable sensor for implantable hearing aids," Biomed Microdevices, 2007, Springer, USA (11 pages).
Web site publication, "Encapsulation for RF MEMS," http://micromachine.stanford.edu/~kuanlinc/Professional/Encapsulation%20for%20RF%20 . . . Downloaded Apr. 1, 2011, (4 pages).
International Search Report and Written Opinion in corresponding PCT Application (i.e., PCT/US2012/033542), completed Sep. 18, 2012 (9 pages).

*Primary Examiner* — Thien F Tran
(74) *Attorney, Agent, or Firm* — Maginot, Moore & Beck

(57) ABSTRACT

In one embodiment, a method of forming a plug includes providing a base layer, providing an intermediate oxide layer above an upper surface of the base layer, providing an upper layer above an upper surface of the intermediate oxide layer, etching a trench including a first trench portion extending through the upper layer, a second trench portion extending through the oxide layer, and a third trench portion extending into the base layer, depositing a first material portion within the third trench portion, depositing a second material portion within the second trench portion, and depositing a third material portion within the first trench portion.

20 Claims, 4 Drawing Sheets

WAFER WITH RECESSED PLUG

This application claims the benefit of U.S. Provisional Application No. 61/475,457, filed on Apr. 14, 2011.

FIELD OF THE INVENTION

This invention relates to wafers and substrates such as are used in micromechanical electrical system (MEMS) devices or semiconductor devices.

BACKGROUND

Device isolation typically is achieved by utilizing local oxidation of silicon ("LOCOS") or shallow trench isolation ("STI") techniques. In the STI device isolation technique, isolation is typically achieved by forming a recess or trench in a layer that is destined to become two adjacent active areas, and filling the trench with an isolation material. The material in the trench, typically a nitride material, is referred to as a spacer. Nitride spacers, in addition to electrical isolation, may also be used as a fluid barrier.

STI is beneficial in providing higher packing density, improved isolation, and greater planarity, by avoiding the topographical irregularities encountered when using conventional thick film oxide isolation (LOCOS). In particular, the growth of thermal field oxide using a mask, such as nitride, creates an encroachment of the oxide into the active areas; this encroachment is referred to as the bird's beak effect.

Isolation using STI, however, has some limitations. For example, there is a relatively short diffusion path along the junction of the spacer and the underlying substrate for fluids (gas and liquids). Accordingly, there is an increased potential for leakage. Additionally, because the spacer is deposited on the surface of the substrate layer, the spacer is susceptible to shear forces which can lead to leakage and even failure of the device at the junction of the spacer and the underlying substrate.

What is needed therefor is a plug and method of forming a plug that overcomes one or more problems in known plugs. It would be beneficial if the plug and method of forming a plug could increase the diffusion path past the plug. It would be further beneficial if the plug and method of forming a plug could increase the strength of the plug-to-substrate layer interface.

SUMMARY

In one embodiment, a method of forming a plug includes providing a base layer, providing an intermediate oxide layer above an upper surface of the base layer, providing an upper layer above an upper surface of the intermediate oxide layer, etching a trench including a first trench portion extending through the upper layer, a second trench portion extending through the oxide layer, and a third trench portion extending into the base layer, depositing a first material portion within the third trench portion, depositing a second material portion within the second trench portion, and depositing a third material portion within the first trench portion.

In a further embodiment, A wafer includes a base layer, an intermediate oxide layer above an upper surface of the base layer, an upper layer above an upper surface of the intermediate oxide layer, a trench including a first trench portion extending through the upper layer, a second trench portion extending through the oxide layer, and a third trench portion extending only partially into the base layer, and a plug, the plug including a first material portion deposited within the third trench portion, a second material portion deposited within the second trench portion, and a third material portion deposited within the first trench portion.

DESCRIPTION

Figure 1:
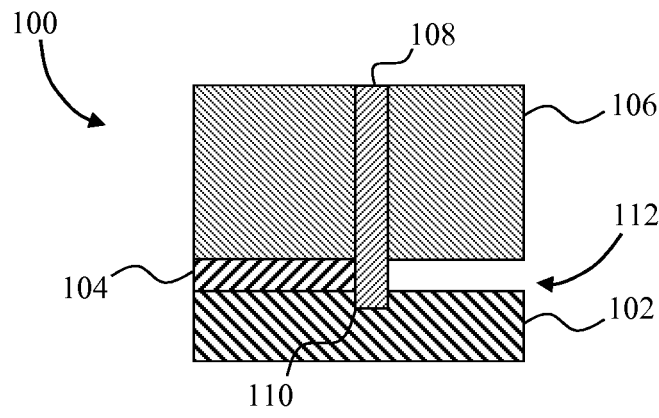
FIG. 1 depicts a partial cross sectional view of a wafer including a plug with a recessed portion extending into the base or substrate layer of the wafer in accordance with principles of the invention.
Figure 2:
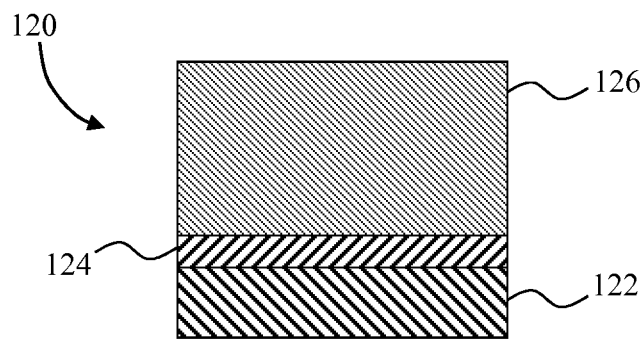
FIG. 2 depicts a partial cross sectional view of a wafer including a base layer, an intermediate layer, and an upper layer in which a plug may be formed.

For the purposes of promoting an understanding of the principles of the invention, reference will now be made to the embodiments illustrated in the drawings and described in the following written specification. It is understood that no limitation to the scope of the invention is thereby intended. It is further understood that the present invention includes any alterations and modifications to the illustrated embodiments and includes further applications of the principles of the invention as would normally occur to one skilled in the art to which this invention pertains.

FIG. 1 depicts a wafer 100 which includes a base or substrate layer 102, an intermediate layer 104, and an upper layer 106. The substrate layer 102 and upper layer 106 may comprise silicon or another suitable material while the intermediate layer 104 may comprise silicon dioxide.

The wafer 100 further includes a plug 108. The plug 108 extends from the upper surface of the wafer 100 completely through the upper layer 106 and the intermediate layer 104 while a recessed portion 110 extends partially into the substrate layer 102. The recessed portion 110 provides improved adhesion to the substrate layer 102. Additionally, the recessed portion 110 provides increased strength in that the ability of the plug 108 to withstand shear forces is a function of the material used to form the plug 108, and not just a function of a bond formed between the plug 108 and the substrate layer 102.

Additionally, the recessed portion 110 creates a tortuous path along the junction of the plug 108 and the substrate layer 102. Consequently, fluids such as air or liquid present in the intermediate layer 104 on one side of the plug 108 are effectively isolated from the portion of the intermediate layer 104 on the other side of the plug 108. Thus, a gap 112 in FIG. 1 may be maintained in a desired condition, i.e., under vacuum, at a given pressure, or composed of a specific fluid, even if the remainder of the intermediate layer 104 is not in the same condition.

FIGS. 2-6 depict one procedure which may be used to manufacture a wafer with a plug such as the wafer 100. The procedure includes the provision of a wafer 120 depicted in FIG. 2. The wafer 120 includes a substrate layer 122, an intermediate layer 124, and an upper layer 126. The wafer 120 may be a silicon-on-insulator wafer, a polysilicon deposited on oxide wafer, or another desired material combination. In one embodiment, the intermediate layer 124 may be a device layer and the upper layer 126 may be a cap layer.

Figure 3:
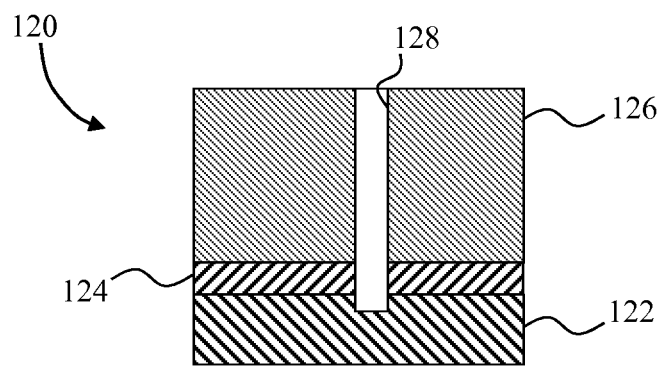
FIG. 3 depicts a partial cross sectional view of the wafer of FIG. 2 with a trench formed through the upper layer, the intermediate layer, and partially into the base layer.
Figure 4:
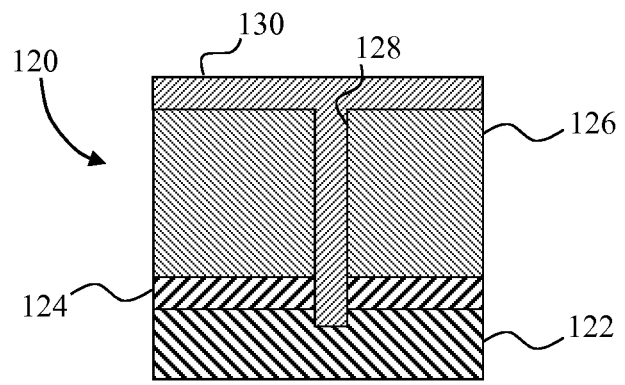
FIG. 4 depicts a partial cross sectional view of the wafer of FIG. 3 with the trench filled with a plug material and with the plug material deposited on the upper surface of the upper layer.

A trench 128 is then etched through the upper layer 126, the intermediate layer 124, and partially into the substrate layer 122 as depicted in FIG. 3. Etching may be accomplished by dry etching. Once the trench 128 has been formed, a plug material 130 is deposited in the trench 128 and on the upper surface of the upper layer 126 (see FIG. 4). The plug material 130 may be a silicon nitride or other desired material. The plug material 130 that is present on the upper surface of the upper layer 126 is then removed if desired. Selective removal of the plug material 130 may be accomplished using chemical mechanical polishing (CMP) or any other acceptable technique including anisotropic etching. Removal of the desired amount of plug material 130 in this embodiment results in the configuration of FIG. 5.

Figure 5:
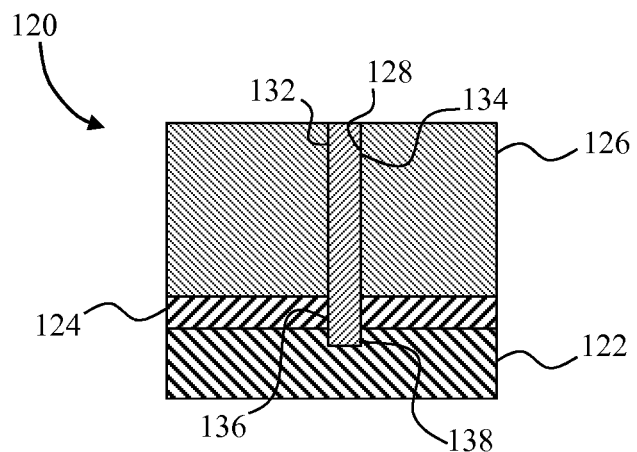
FIG. 5 depicts a partial cross sectional view of the wafer of FIG. 4 after CMP has been used to remove the portion of the plug material that was deposited on the upper layer of the upper surface.
Figure 6:
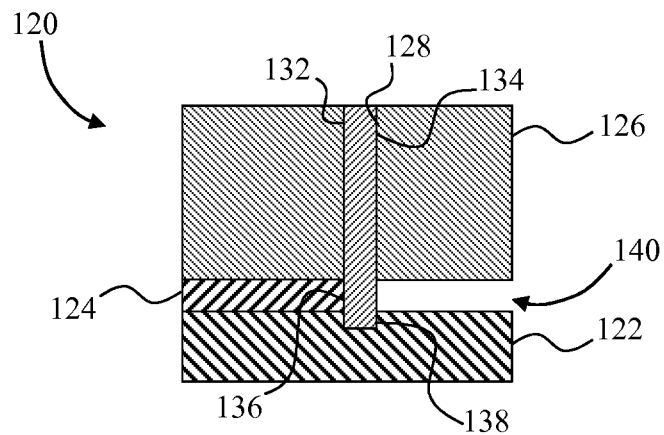
FIG. 6 depicts a partial cross sectional view of the wafer of FIG. 5 after a portion of the intermediate layer has been selectively etched.

In FIG. 5, a remainder of the plug material 130 forms a plug 132. The plug 132 includes an upper portion 134 which extends from the upper surface of the wafer 120 to the lower surface of the upper layer 126. A middle portion 136 of the plug 132 extends from the lower surface of the upper layer 126 to the upper surface of the substrate layer 122. A lower portion 138 of the plug 132 extends from the upper surface of the substrate layer 122 to an intermediate location in the wafer 120.

The wafer 120 may then be further processed in any desired manner. In this embodiment, a portion of the intermediate layer 124 is selectively etched to create a gap 140 shown in FIG. 6. The gap 140 may be filled with a fluid, pressurized, or placed in a vacuum. In any event, the plug 132 isolates the gap 140 and provides structural support for the wafer 120.

Figure 7:
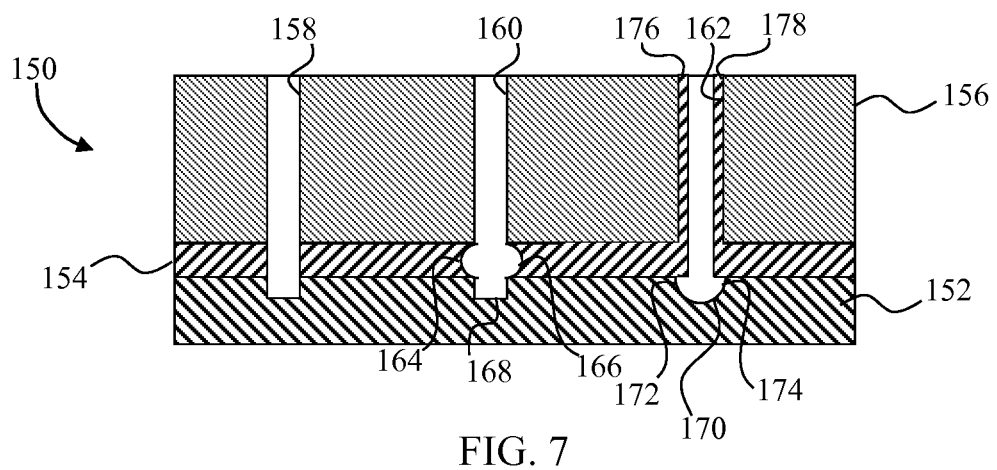
FIG. 7 depicts a partial cross sectional view of a wafer including a base layer, an intermediate layer, and an upper layer, wherein trenches with different shapes have been formed using various etching techniques in accordance with principles of the invention.

The procedure depicted in FIGS. 2-6 may be modified in a number of ways. By way of example, FIG. 7 depicts a wafer 150 that includes a substrate layer 152, an intermediate layer 154, and an upper layer 156. The substrate layer 152 and the upper layer 156 in this embodiment are silicon while the intermediate layer 154 is a silicon dioxide. Trenches 158, 160, and 162 are etched through the upper layer 156, the intermediate layer 154, and partially into the substrate layer 152.

The trench 158 may be etched in substantially the same manner as the trench 128 of FIG. 3. The trench 160 may be etched by an isotropic oxide etch. The isotropic oxide etch results in increased etching of the intermediate layer 154, forming expanded areas 164 and 166. A recessed area 168 may be formed by anisotropic etching following the oxide etch. The expanded areas 164 and 166 extend laterally within the intermediate layer 154 to locations directly underneath an un-etched portion of the upper layer 156 and directly above an un-etched portion of the substrate layer 152. The recessed area 168 extends partially into the substrate layer 152.

The trench 162 may be formed using an isotropic final silicon etch. The trench 162 includes a recessed portion 170 that includes expanded areas 172 and 174. The expanded areas 172 and 174 extend laterally within the substrate layer 152 to locations directly underneath an un-etched portion of the intermediate layer 154. The trench 162 further includes sidewall protecting layers 176 and 178. The sidewall protecting layers 176 and 178 prevent etching of the upper layer 156 during etching of the substrate layer 152.

Figure 8:
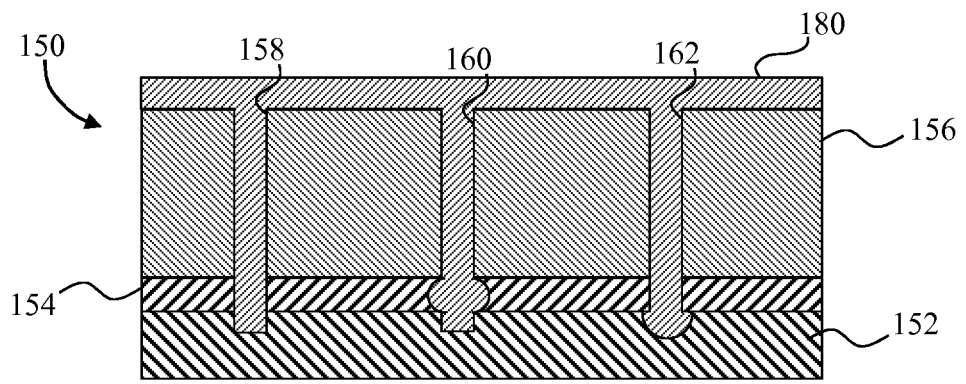
FIG. 8 depicts a partial cross sectional view of the wafer of FIG. 7 with a plug material deposited within the trenches and on the upper surface of the upper layer.

Once the trenches 158, 160, and 162 have been formed, a plug material 180 is deposited in the trenches 158, 160, and 162 and on the upper surface of the upper layer 156 (see FIG. 8). The plug material 180 that is present on the upper surface of the upper layer 156 is then removed if desired. Removal of the desired amount of plug material 180 in this embodiment results in the configuration of FIG. 9.

Figure 9:
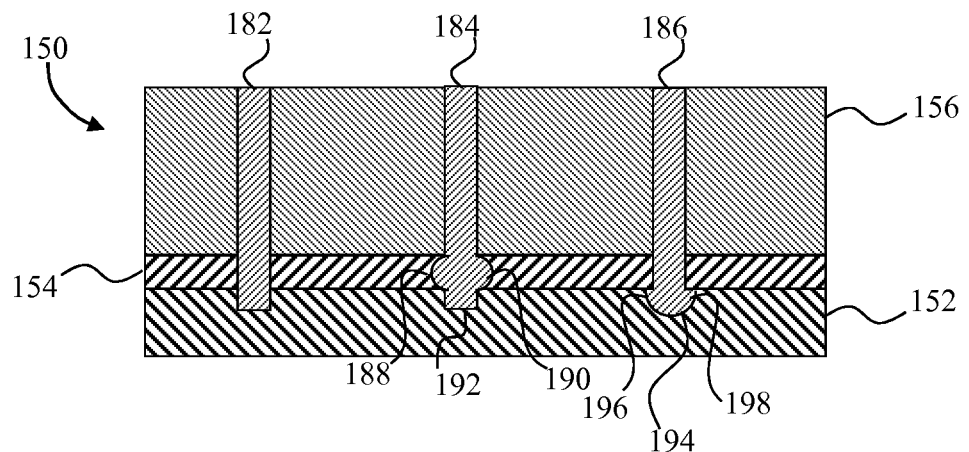
FIG. 9 depicts a partial cross sectional view of the wafer of FIG. 8 after the plug material on the upper surface of the upper layer has been removed by CMP leaving plugs of different shapes in the wafer.

In FIG. 9, a remainder of the plug material 180 forms plugs 182, 184, and 186. The plug 182 is similar to the plug 132 of FIG. 6. The plug 184 includes expanded areas 188 and 190 and recessed area 192. The expanded areas 188 and 190 extend laterally within the intermediate layer 154 to locations directly underneath an un-etched portion of the upper layer 156 and directly above an un-etched portion of the substrate layer 152. The recessed area 192 extends partially into the substrate layer 152.

The plug 186 includes a recessed portion 194 that includes expanded areas 196 and 198. The expanded areas 196 and 198 extend laterally within the substrate layer 152 to locations directly underneath an un-etched portion of the intermediate layer 154.

Figure 10:
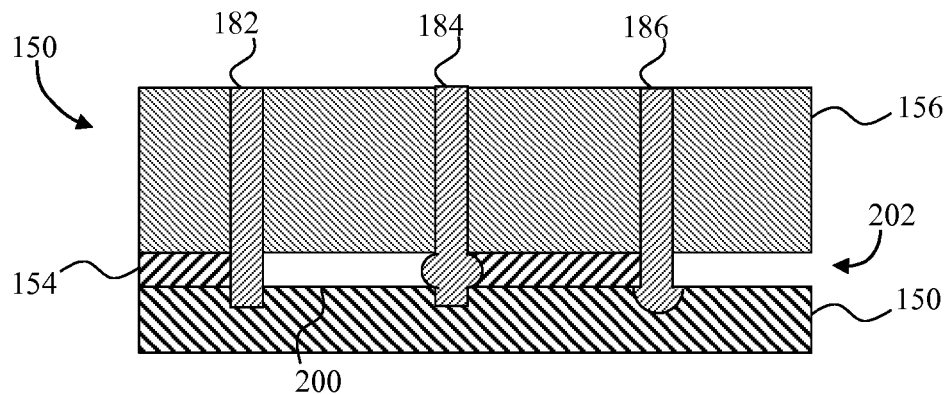
FIG. 10 depicts a partial cross sectional view of the wafer of FIG. 9 after selective portions of the intermediate layer have been removed.

The wafer 150 may then be further processed in any desired manner. In this embodiment, portions of the intermediate layer 154 are selectively etched to create gaps 200 and 202 shown in FIG. 10. The plugs 182, 184, and 186 may be used an etch stops during the etching process. The increased material of the plugs 184 and 186 provide increased resistance to movement of the plugs 184 and 186 upwardly away from the substrate layer 152.

Figure 11:
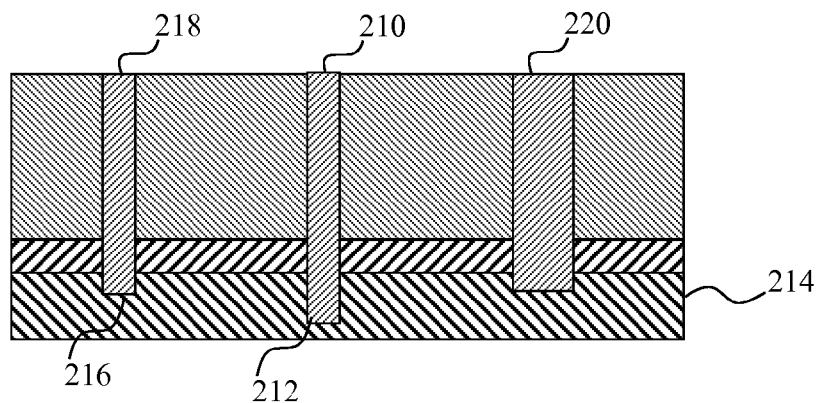
FIG. 11 depicts a partial cross sectional view of a wafer including plugs with different widths and with recessed portions of different lengths.

In addition to the expanded areas described above, a plug may be further modified to provide desired performance characteristics in a variety of manners. As depicted in FIG. 11, plug 210 includes a recessed portion 212 that is more deeply embedded into a substrate layer 214 than a recessed portion 216 of a plug 218. Thus, as compared to the plug 218, the plug 210 provides increased resistance to movement of the plug 210 out of the substrate layer 214. Moreover, plug 220 is wider than both the plug 210 and the plug 218. The plug 220 thus provides increased resistance to shear forces. Accordingly, mechanical strength and the contact area between a plug and a substrate can be modified for particular applications.

Figure 12:
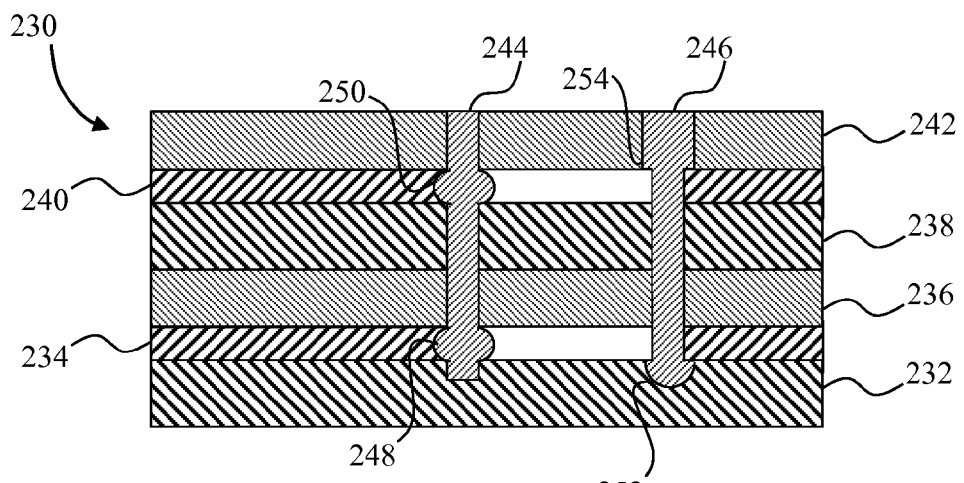
FIG. 12 depicts a partial cross sectional view of a wafer including plugs which may be used to clamp two or more layers of the wafer together.

FIG. 12 depicts a wafer 230 which may be formed by modification of the procedures discussed above to clamp one or more layers using a plug. The wafer 230 includes a base or substrate layer 232, intermediate layers 234, 236, 238, and 240 and an upper layer 242. The wafer 230 further includes plugs 244 and 246. The plug 244 includes enlarged areas 248 and 250 while the plug 246 includes enlarged areas 252 and 254.

In addition to the increased stress resistance of the plugs described above, the plugs 244 and 246 provide resistance to separation of layers clamped by the plugs. Thus, plug 244 clamps the intermediate layers 236 and 238 together while the plug 246 clamps the intermediate layers 234, 236, 238, and 240 together. Accordingly, plugs as disclosed herein may be modified to incorporate a number of different enlarged areas to further maintain the integrity of a wafer.

While the invention has been illustrated and described in detail in the drawings and foregoing description, the same should be considered as illustrative and not restrictive in character. It is understood that only the preferred embodiments have been presented and that all changes, modifications and further applications that come within the spirit of the invention are desired to be protected.

The invention claimed is:

1. A method of forming a plug comprising:
providing a base layer;
providing an intermediate oxide layer above an upper surface of the base layer;
providing an upper layer above an upper surface of the intermediate oxide layer;
etching a first trench including a first trench portion extending through the upper layer, a second trench portion extending through the intermediate oxide layer, and a third trench portion extending into the base layer;
depositing a first material portion within the third trench portion;
depositing a second material portion within the second trench portion;
depositing a third material portion within the first trench portion; and
release etching at least a portion of the intermediate oxide layer adjacent to the second material.

2. The method of claim 1, wherein etching the first trench further comprises:
etching a fourth trench portion within the intermediate oxide layer and directly below an un-etched area of the upper layer.

3. The method of claim 2, wherein etching a fourth trench portion comprises:
performing an isotropic oxide etch.

4. The method of claim 1, wherein etching the first trench further comprises:
etching a fifth trench portion within the base layer and directly below an un-etched area of the intermediate oxide layer.

5. The method of claim 4, wherein etching a fifth trench portion comprises:
performing an isotropic silicon etch.

6. The method of claim 1, wherein:
etching the first trench further comprises etching a fifth trench portion within the base layer, and a sixth trench portion within the intermediate oxide layer;
the fifth trench portion and the sixth trench portion are straight below an un-etched area of the upper layer;
depositing a first material portion within the third trench portion comprises depositing the first material portion within the fifth trench portion; and
depositing a second material portion within the second trench portion comprises depositing the second material portion within the sixth trench portion, such that the maximum width of the first material and the maximum width of the second material is greater than the maximum width of the third material when viewed in cross section.

7. The method of claim 1, wherein the first material portion, the second material portion, and the third material portion comprise silicon nitride.

8. The method of claim 1, wherein etching a first trench further comprises etching a fourth trench portion in an upper oxide layer above an upper surface of the upper layer, the method further comprising:
depositing a fourth material portion within the fourth trench portion.

9. The method of claim 8, further comprising:
release etching at least a portion of the upper oxide layer adjacent to the fourth material.

10. The method of claim 9, wherein etching the first trench further comprises:
etching a fifth trench portion within the base layer and directly below an un-etched area of the upper oxide layer.

11. The method of claim 10, further comprising:
depositing a fifth material directly above the un-etched area of the upper oxide layer.

12. The method of claim 9, wherein depositing the second material comprises:
depositing a portion of the second material portion at a location directly below an un-etched portion of the upper layer.

13. The method of claim 12, wherein depositing the fourth material comprises:
depositing a portion of the fourth material portion at a location directly above the un-etched portion of the upper layer.

14. The method of claim 8, further comprising:
etching a second trench through the upper oxide layer, the upper layer, the intermediate oxide layer and into the base layer; and
depositing a fifth material within the second trench, wherein release etching the at least a portion of the intermediate oxide layer adjacent to the second material comprises release etching all of the intermediate oxide layer between second material and the fifth material.

15. The method of claim 14, further comprising:
release etching all of the upper oxide layer between the fourth material and the fifth material.

16. A method of forming a plug comprising:
providing a base layer;
providing an intermediate oxide layer above an upper surface of the base layer;
providing an upper layer above an upper surface of the intermediate oxide layer;
etching a trench including
a first trench portion extending through the upper layer,
a second trench portion extending through the intermediate oxide layer,
a third trench portion extending into the base layer
a fourth trench portion within the base layer straight below an un-etched area of the upper layer, and
a fifth trench portion within the intermediate oxide layer straight below the un-etched area of the upper layer;
depositing a first material portion within the third trench portion and the fourth trench portion;
depositing a second material portion within the second trench portion and the fifth trench portion; and
depositing a third material portion within the first trench portion, such that the maximum width of the first material and the maximum width of the second material is greater than the maximum width of the third material when viewed in cross section.

17. The method of claim 16, wherein etching the fifth trench portion comprises:
performing an isotropic oxide etch.

18. The method of claim 16, wherein etching the fourth trench portion comprises:
performing an isotropic silicon etch.

19. The method of claim 16, wherein the first material portion, the second material portion, and the third material portion comprise silicon nitride.

20. The method of claim 16, further comprising:
release etching at least a portion of the intermediate oxide layer adjacent to the second material.

* * * * *